United States Patent [19]
Arakawa et al.

[11] Patent Number: 5,543,713
[45] Date of Patent: Aug. 6, 1996

[54] GROUND BREAKER FOR MULTIPLE CONTROL LINES

[75] Inventors: Mitsuaki Arakawa, Hillsborough, Calif.; Takashi Minemura, Otawara, Japan; Stephen Krasnor, Berkeley, Calif.

[73] Assignee: The Regents of the University of California, Berkeley, Calif.

[21] Appl. No.: 352,187

[22] Filed: Dec. 1, 1994

[51] Int. Cl.⁶ ............................................. G01V 3/00
[52] U.S. Cl. .................. 324/322; 324/318; 128/653.5
[58] Field of Search ................................. 324/300, 309, 324/318, 322, 307, 311, 312, 313, 314, 303; 128/653.2, 653.3, 653.5

[56] References Cited

U.S. PATENT DOCUMENTS

| | | | |
|---|---|---|---|
| 4,633,181 | 12/1986 | Murphy-Boesch | 324/322 |
| 4,682,125 | 7/1987 | Harrison et al. | 324/322 |
| 4,763,074 | 8/1988 | Fox | 324/314 |
| 4,763,076 | 8/1988 | Arakawa et al. | 324/300 |
| 4,782,298 | 11/1988 | Arakawa et al. | 324/322 |
| 4,825,162 | 4/1989 | Roemer et al. | 324/322 |
| 4,922,204 | 5/1990 | Duerr et al. | 324/322 |
| 5,162,739 | 11/1992 | Doty | 324/322 |
| 5,294,886 | 3/1994 | Duerr | 324/322 |
| 5,351,688 | 10/1994 | Jones | 128/653.5 |
| 5,371,466 | 12/1994 | Arakawa et al. | 324/322 |
| 5,450,011 | 9/1995 | Boeijen et al. | 324/322 |

OTHER PUBLICATIONS

Roemer, et al., "The NMR Phased Array", Magnetic Resonance In Medicine, vol. 16, No. 2, Nov. 1990, pp. 192–225.
H. W. Ott, "Noise Reduction Techniques in Electronic Systems", John Wiley & Sons (1976).

Primary Examiner—Michael Tokar
Attorney, Agent, or Firm—Nixon & Vanderhye P.C.

[57] ABSTRACT

A RF choke for use in shielded cable control lines between a RF receive and transmit coil and the control circuitry of a MRI system is disclosed. The RF choke is formed of conductive tubing in the shape of a coil, within which the control signal wires are housed. A capacitor is added in parallel with the conductive tubing coil to complete a resonance circuit acting as a choke to spurious RF currents.

14 Claims, 5 Drawing Sheets

GROUND BREAKER FOR MULTIPLE CONTROL LINES

FIELD OF THE INVENTION

This invention generally relates to radio frequency interference chokes designed to impede the flow of spurious RF currents that may be carried on the shielding jacket of control line cables. The invention has particular application to an improved magnetic resonance imaging (MRI) system where the present RFI choke assembly interrupts spurious RF currents on the RF ground loop between a receiver coil set and its associated coil control lines.

BACKGROUND OF THE INVENTION

MRI systems utilize RF coils to transmit RF signals into selected portions of a body to excite magnetically aligned nuclei within that body. MRI devices typically employ at least one RF coil for transmitting the RF signals and either the same or another RF coil for receiving RF signals generated by the excited nuclei in the body. As may be expected, the switching of the RF transmit and receive coils are carefully controlled by a computer electrically connected to the respective coils (and the components associated with the coils, such as matching circuits and detuners) by control lines.

The control lines connecting the RF coils (and their associated components) to the computer are often a major source of RF coil system instability. This is caused by spurious RF currents carried along the surface of the RF shielding jacket associated with the control lines. Specifically, the cables that carry the control signals for the RF coils are generally surrounded by a conductive tubing to prevent RF signals from interfering with the signals on the control lines (and vice versa). The shielding jacket is grounded on a common ground to the coils and the computer controller. Thus, during RF transmissions, some of the RF energy may travel through a ground loop beginning in the control line shieldings and emerging in the digital and analog control circuits of the computer. This spurious RF energy on the ground lines of the control circuits can cause control circuit malfunctions, the production of spurious analog signals, degradation in the RF transmitter coil Q. Similarly, the spurious RF energy can cause receiver coil Q degradation and reduced isolation between the receiver coils.

While problems in maintaining isolation of the RF coils can be caused by coil-to-coil coupling, the present invention relates more particularly to conductive coupling. Coil-to-coil coupling is caused by the electrical and magnetic fields which the RF coils are designed to produce. Some of this coupling between the coils can be reduced by placing a number of capacitors in series with the coil traces, by placing some of the coils orthogonal to one another, or by allowing part of the coil traces to overlap slightly. Further reduction in this coupling can be achieved by using a low input impedance preamplifier as a part of a matching circuit to form an electrical trap circuit which would reduce coupling between the receiver coils. Conductive coupling, on the other hand, may not respond to even carefully executed decoupling strategies.

This conductive coupling can be caused by interconnecting control cables. Because the cables not only carry control signals but may also carry a spurious RF current, coupling between the RF coil and the connecting cable interface (conductive coupling) can occur. During the transmission period of an MRI session, if sufficient RF energy finds its way into the digital and analog circuits via the control signal lines, a control circuit malfunction and spurious analog signals can be produced. The coupling can also degrade receiver coil Q and coil-to-coil isolation.

The RF current on the control lines themselves can be effectively blocked by adding LC or RC filters in series with the control lines. However, physically large RF coils can couple inductively as well as capacitively to the cables even though the interfacing cables have filters on the control wires. Also ground loop currents through the shield jacket of the interfacing cables are not affected by the filters. Filters alone thus have had difficulty in dealing with the spurious RF energy.

These problems associated with induced RF currents in the ground loops through the shielding of the control lines are worsened by the high frequency at which the MRI devices operate. Due to the nature of the MRI process, the RF coils must transmit and receive RF signals of a predetermined frequency (the so-called "Larmor frequency," which will depend upon the magnitude of the magnetic fields employed and the magnetogyric ratio of the nuclei being imaged; the frequency is approximately 15 MHz in some machines). At these high frequencies, achieving a single point ground is impractical because the capacitive reactance of the shielded jacket to ground is low, even though the shield o may not be mechanically attached by a conductive wire to ground.

Techniques used to eliminate ground loop currents in multiple-ground systems can be found in the text book "Noise Reduction Techniques in Electronic Systems," H. W. Ott, John Wiley & Sons (1976). These techniques include the use of isolation transformers, the winding of coaxial cables around magnetic cores, and the use of optic couplers. The transformer and magnetic core techniques, however, are not suitable for RF coils because they include strongly magnetic materials that interfere with the static magnet used in the MRI device. These techniques would cause particular problems in MRI systems where one is attempting to generate homogeneous magnetic fields in the imaging area. The use of an optical coupler to interrupt the ground loop in an MRI device would require considerable engineering effort.

Other methods for reducing radio frequency interference caused by the ground loops between the control circuitry and the RF coils includes 1) double shielding the RF coaxial cables between the control device and the RF coils and 2) shielding the control circuitry in a shielding enclosure. These methods have proven to be relatively costly and are often ineffective.

Harrison et al., U.S. Pat. No. 4,682,125 (commonly assigned with the present application) discloses an RFI choke for use in the coaxial cables carrying the RF signals between the RF coils and the RF transmitter/receiver.

The Harrison et al. RFI choke assembly includes a coil of coaxial cable between the RF coil and the transmitter/receiver having a number of turns that provide a certain inductance and a lump fixed capacitance connected in parallel across the coiled section. Harrison et al also provides a tuning rod of brass, copper or aluminum positioned within the center of the coil section to achieve more precise parallel resonance. While Harrison o et al. used its RF ground breaker to interrupt the coil coupling through the coaxial cables between the RF coils and the transmitter/receiver, the Harrison et al. RF ground breakers do not break the ground loop through the shield jacket on the control lines between the RF coils and the control circuitry.

SUMMARY OF THE INVENTION

The present invention interrupts the RF ground loop created by the shielding jacket of the coil control lines, thus providing improved RF coil Q, improved isolation between respective RF coils, and improved isolation between the RF coils and the control circuitry. The present invention interrupts the RF current path on the surface of the shield between the RF coils and the control circuitry by shaping the shield into an inductor and adding a parallel capacitance to form a resonance circuit operating at the Larmor frequency. The example embodiments of the present invention would provide a parallel resonance circuit with an impedance on the order of 1 kΩ to 10 kΩ, virtually eliminating the ground loop path to RF signals between the RF coil and the control circuitry.

The invention is particularly useful for a receiver coil set having multiple RF coil elements and PIN diode/varactor diode controls. In these instances, isolation of RF coils is particularly important since the PIN/varactor diode controls tend to worsen the isolation problems.

These as well as other objects and advantages of the invention will be more completely understood and appreciated by carefully reviewing the following detailed description of the presently preferred exampled embodiment, taken in conjunction with the drawings, of which:

DETAILED DESCRIPTION OF THE PRESENTLY PREFERRED EXAMPLED EMBODIMENTS

Figure 1:
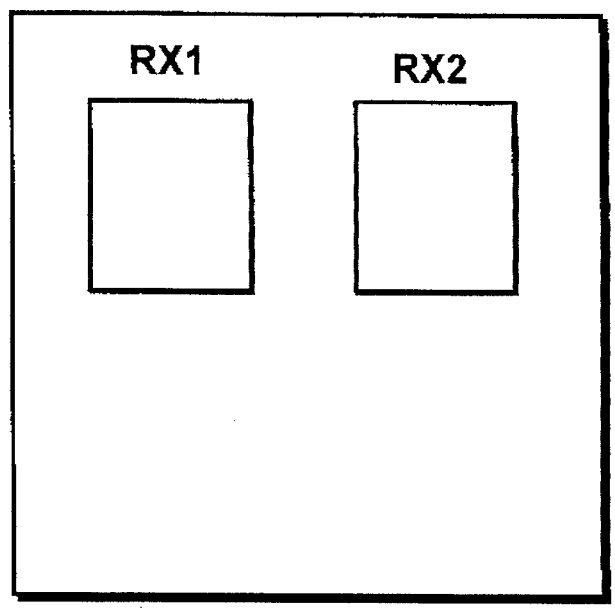
FIG. 1 is a schematic diagram of an RF transmission coil and receiver coil assembly.

As shown in FIG. 1, MRI assemblies typically employ a RF transmission coil, TX, to transmit high-powered RF signals into a body to cause magnetically aligned nuclei in the body to tip 90° or 180° from their aligned position. The transmission sequence continues for a predetermined pulse time sufficient to cause a number of the nuclei to tip. The RF transmission sequence then ceases for a period. After the transmission sequence some number of receiver coils (e.g., two coils in FIG. 1), RX1 and RX2, detect very low-power signals that are generated by the nuclei as they move toward realignment, that is toward their original position before the RF transmission occurred. These RF transmission and reception sequences are controlled via control lines between the RF coils and a computer.

Unfortunately, during RF transmission, some of the E/M field generated by the high power transmit coil, TX, induces currents in the RF receiver coils, RX1 and RX2, which can be carried back to the computer controller via ground loops in the control lines between the receiver coils and the computer.

Figure 2:
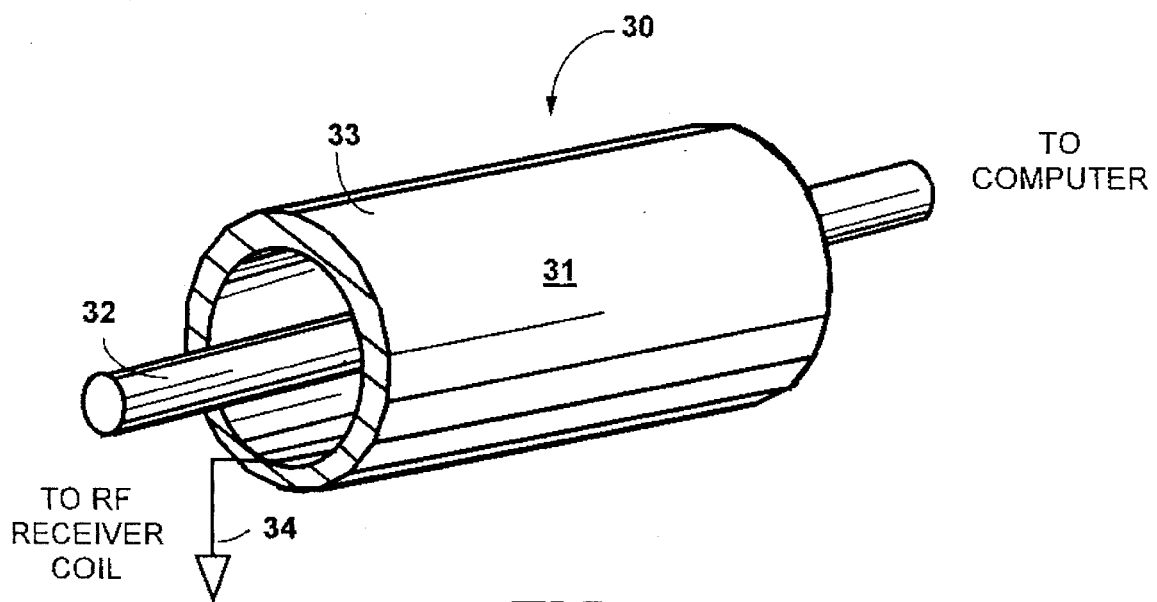
FIG. 2 is an isometric view of an RF receiver coil control line.

This ground loop occurs on the outside of the shielding jacket on the control lines between the receiver coils, RX1 and RX2, and the computer controller. A shielded control is shown in FIG. 2. The control line 30 is a shielded wire (or wires) and extends between an RF receiver coil and the computer that controls the reception of the RF signals from the receiver coil. The control line 30 includes one or more conductors 32 for carrying RF receiver coil control signals to and from the receiver coil and the computer. The control line 30 includes a shielding jacket 31 to shield the control lines 32 from RF interference.

At some location, the shield jacket 31 is electrically grounded to a common ground with the computer by mechanically attaching a ground lead 34 to the shield jacket to form a "ground loop."

Figure 3:
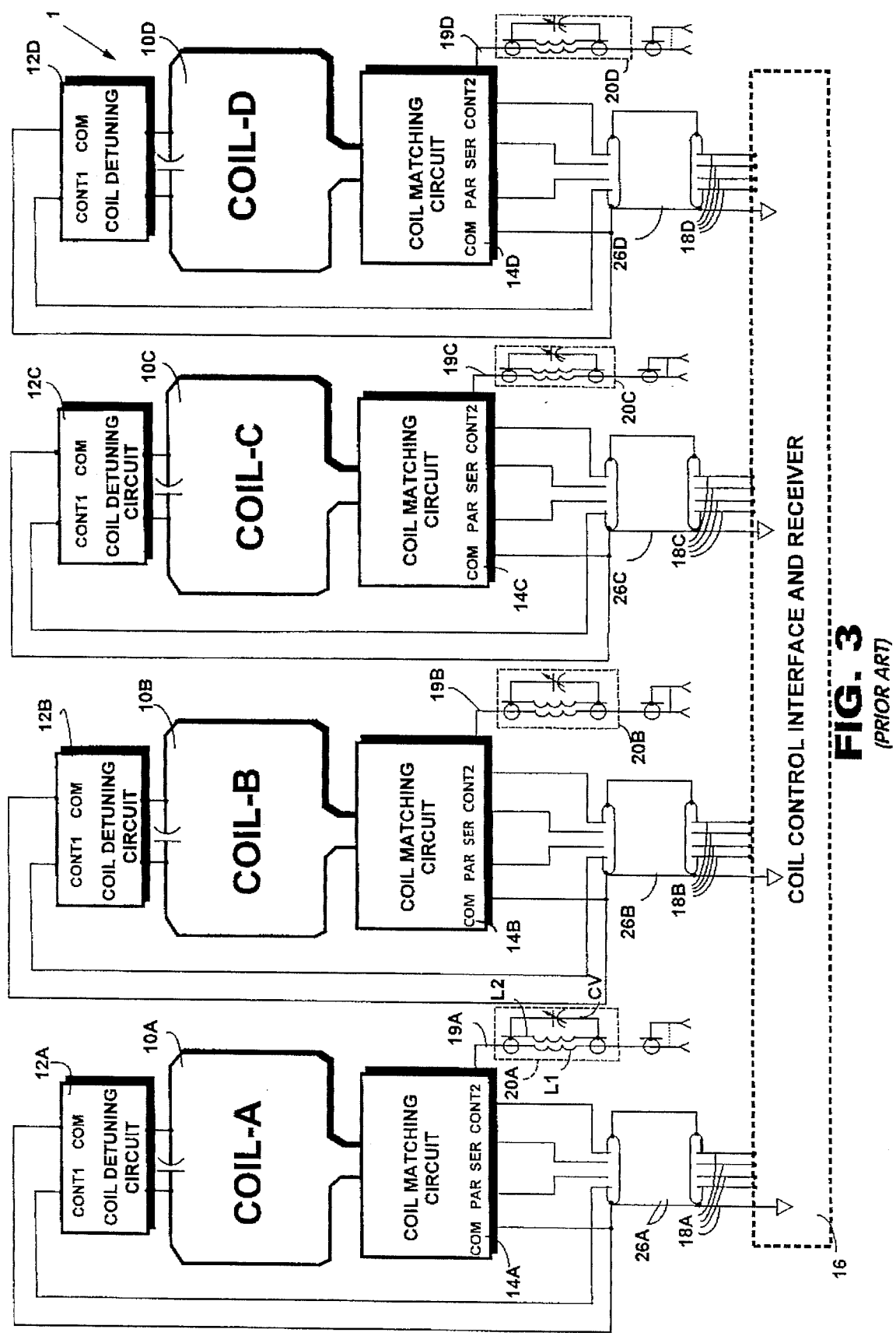
FIG. 3 is a schematic diagram of a prior RF receiver coil assembly.

This ground loop is specifically shown in the multiple receiver coil RF system 1 of FIG. 3. The multiple RF receiver coil system 1 includes, in this embodiment, four RF receiver coils 10A–10D connected to coil detuning circuits 12A–12D and coil matching circuits 14A–14D. The RF coils 10A–10D may be used during the MRI process to receive RF signals o induced by hydrogen nuclei in a human subject. The coil detuning circuits 12A–12D in coil matching circuits 14A–14D are connected to a coil control interface and receiver 16 via control lines 18A–18D. The control lines 18A–18D are in cables with shield ground 26A–26D having common grounds to the coil control interface and receiver 16.

Typically, the control lines 18A–18D are shielded conductors with grounded shield jackets 26A–26D. When the RF transmit coil (not shown) produces high powered RF signals, induced RF energy is carried along the shields jackets 26A–26D of the control lines 18A–18D. Since the shielding jackets are typically conductive outer shrouds that surround the control lines between the control circuitry 16 and the coil matching circuits 14A–14D, the coil detuning circuits 12A–12D, and the RF coil receiver, they substantially prevent unwanted RF energy from being induced on the control lines themselves, but provide conductive paths to the ground plane of the RF coil receiver and control circuitry 16.

The control lines 18A–18D provide communication paths between the coil control circuitry 16 and the components required to control the RF receiver coils during RF transmission and reception. In the examples shown in FIGS. 3 and 4, the control lines 18A–18D include a common line, (COM), control lines (CONT1 and CONT2), parallel varactor diode control (PAR) and serial varactor diode control output (SER). These control lines communicate with the coil detuning circuits 12A–12D and the coil matching circuits 14A–14D. The present invention is not limited to the specific control lines shown and described here, but encompasses other types of componentry with other types of control lines as may be required for a particular application. The control lines 18A–18D are, however, distinguished from the coaxial cables 19A–19D which carry the MRI reception signals from the receiver coils 10A–10D (via the coil matching circuits 14A–14D) to the RF receiver and control circuitry 16.

The spurious RF energy traveling through the shield jackets 26A–26D to the ground plane of the RF control circuitry 16 could cause coil Q degradation, cause errors in digital analog circuits of the RF coil receiver and control circuitry 16, and cause image errors (e.g., image artifacts).

In FIG. 3 nothing breaks the ground loop through the shield jackets 26A–26D for the control lines. The most common symptom of the resultant ground loop current in the receiver coil is an uncertainty or unreliability in achieving good isolation between receiver coils. In a system such as is shown in FIG. 3, changing the cable placement or touching the cable can affect the isolation performance greatly.

As shown in FIG. 3, RF chokes 20A–20D have been used in conjunction with the coaxial cables 19A–19D that carry the RF receive signals to the RF receiver. An RF choke 20A–20D in the coaxial cable 19A–19D can be a coil of coaxial cable together with a variable capacitor. In FIG. 3 the chokes 20A–20D are represented as parallel inductors L1 and L2 together with the variable capacitor $C_v$. This arrangement is effective in inhibiting RF signals carried along the outer conductor of the cables 19A–19D carrying the RF signal output from the RF coil matching circuits 14A–14D to the RF coil receiver and control circuitry 16, but does not prevent spurious RF signals from reaching the RF coil receiver and circuitry 16 via the shield jackets 26A–26D of the control cables 18A–18D.

Figure 4:
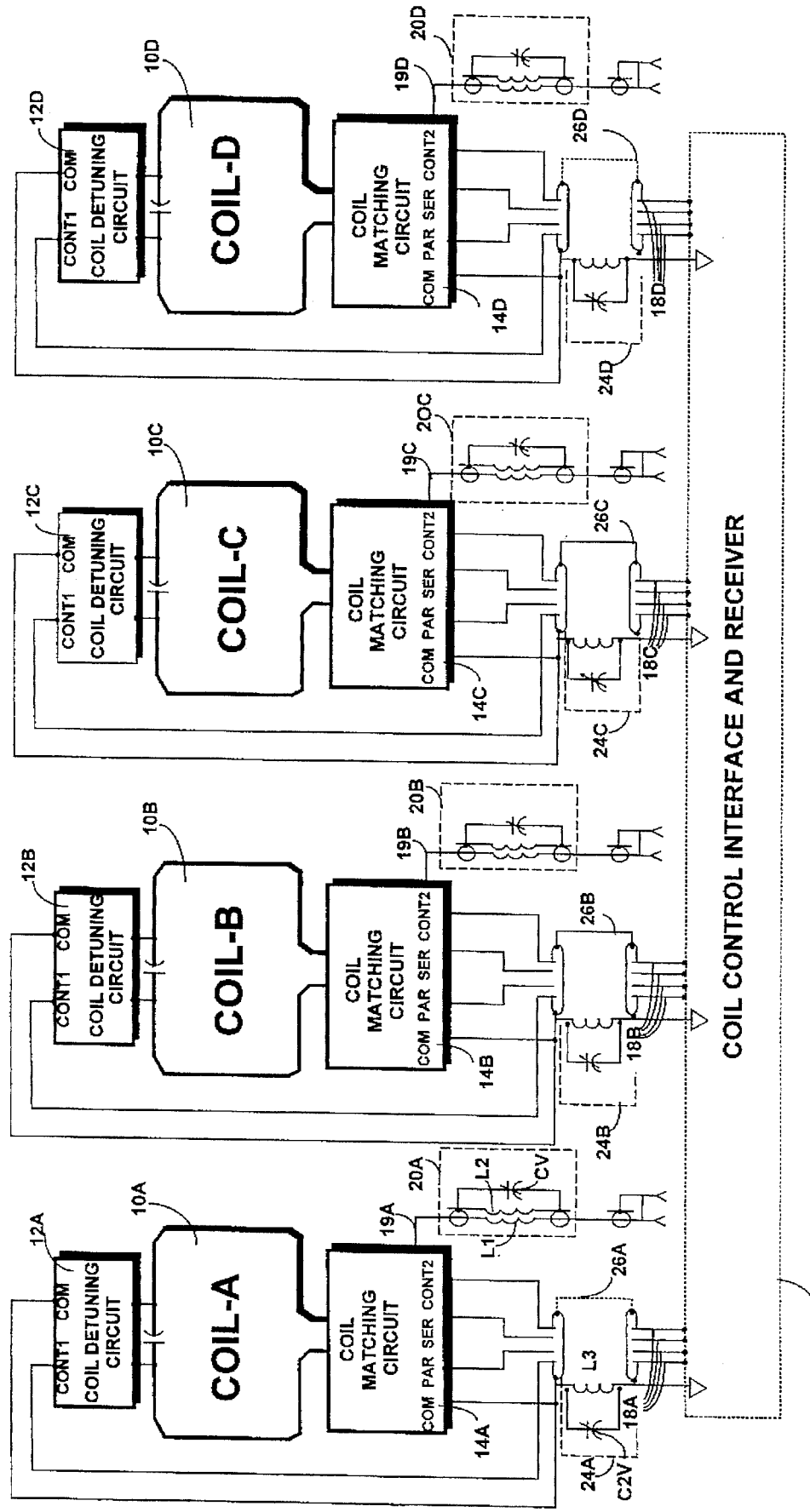
FIG. 4 is an RF receiver coil system according to one embodiment of the present invention.

FIG. 4 is similar to FIG. 3 except RFI chokes 24A–24D provided by the present invention are included on the shield jackets 26A–26D to prevent spurious RF signals from being carried along the shield jackets 26A–26D to the RF coil control circuit 16. As shown in FIG. 4, the present RFI choke 24A–24D may be schematically represented as the parallel combination of the inductance L3 and the variable capacitance $C2_v$. When the present RFI chokes 24A–24D are used in combination with RFI chokes 20A–20D, spurious RF signals that are induced on the shielding of the control lines 18A–18D and the coaxial cable 19A–19D are substantially blocked from reaching the RF coil receiver and control circuitry 16. As a result, the present invention improves the isolation between the RF coil elements by reducing secondary coupling caused by the control lines. Costly double shielded RF coaxial cables and shielded enclosures for the control circuitry can also be eliminated.

Figure 5:
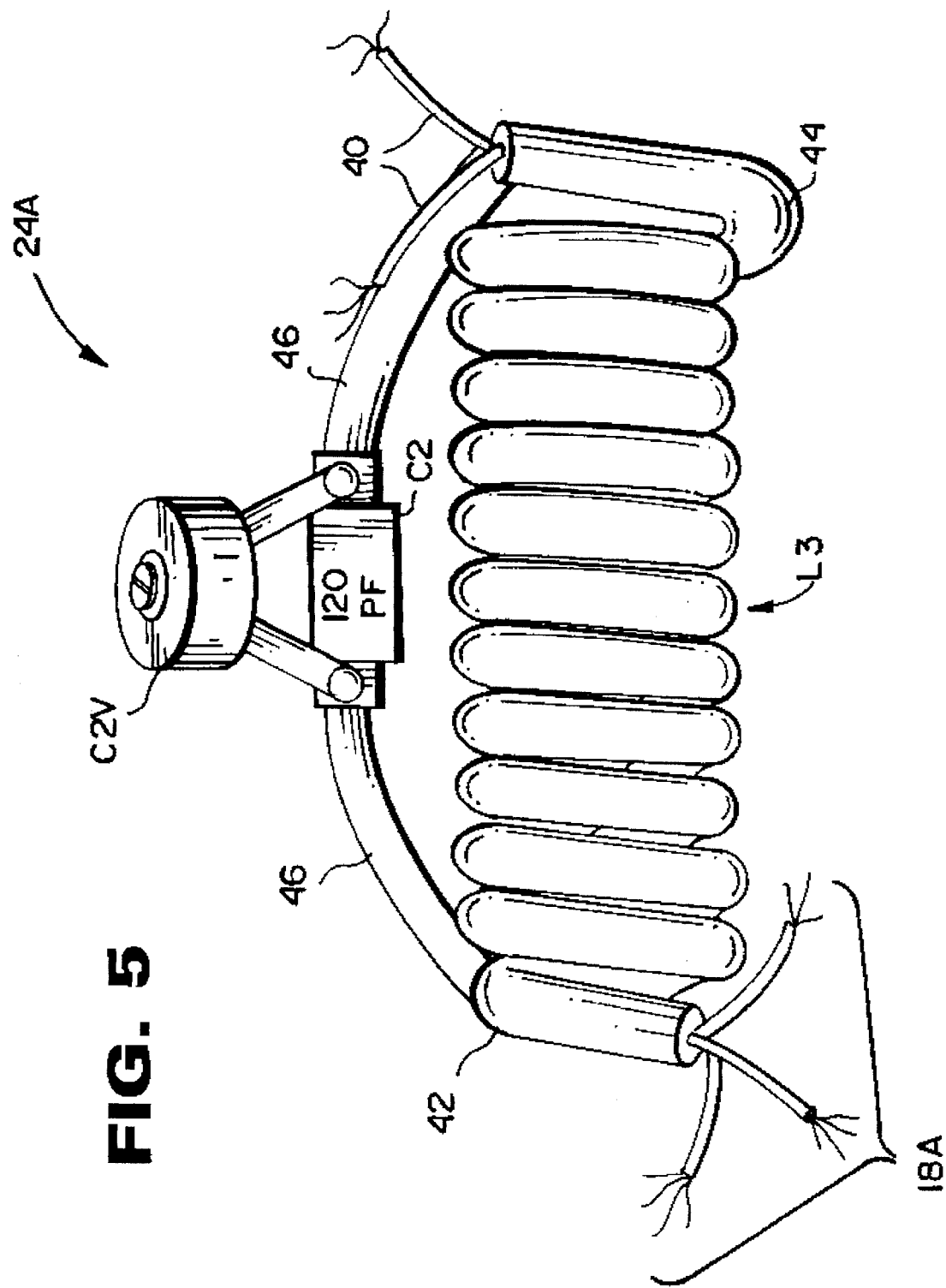
FIG. 5 is an isometric view of the present RFI choke.

The structure of the RFI choke 24A is shown in greater detail in FIG. 5. While only one choke 24A is shown in FIG. 5, each of the chokes 24A–24D (shown in FIG. 4) may take the structure shown in the example choke of FIG. 5. By comparing FIGS. 4 and 5, it will be appreciated that the control lines 18A (FIG. 4) comprise individual wires 40 (FIG. 5) carrying the control signals between the RF coil 10A and the RF receiver and coil control circuitry 16. A conductive tubing 44 shields the control wires 40 from spurious RF signals induced by the RF coils 10A–10D. The conductive tubing 44 (FIG. 5), once grounded, will act as the DC return path from between the RF receiver and coil control circuitry 16 to the coil detuning circuit 12A and the coil matching circuit 14A.

Referring again to FIG. 5, the RFI choke 24A consists of a coil of the conductive shielding 44 amounting to a number of turns. Since the control wires 40 are carried within the conductive tubing 44, they also take the form of the coil with the turns. Connected in parallel to the coil of conductive shielding 44 is a variable capacitance $C2_v$, preferably connected in parallel with a fixed capacitor C2. In the preferred embodiment, the fixed capacitor C2 may be 120 pF and the variable capacitor $C2_v$ may be variable across a range of 15–60 pF. The capacitances C2 and $C2_v$ are electrically connected to the conductive tubing 44 by electrical leads 46 and electrical contacts 42, preferably solder points.

While not shown in FIG. 5, the control wires 40 within the tubing 44 would continue in a generally non-coiled form at the ends of the coils shown on FIG. 3 to span the distance between the electrical contacts at the coil detuning circuit 12A, the coil matching circuit 14A and the RF receiver and coil control circuitry 16, as shown in FIG. 4. The chokes 24A–24D should be located near the coils 10A–10D.

The coils of FIG. 5 need not be in the form shown in FIG. 5, but may be, for example, toroidal.

In an example embodiment, the conductive tubing 44 is made from a 2 mm diameter copper tube, carrying 26 AWG wires 40. When the MRI system is operating at 15 MHz, the conductive tubing 44 can form a coil of 12 turns having an inside diameter of approximately ⅝ inches. The length of the coiled portion can be 4.3 cm. The inductance of the above coil will be approximately 0.75 μH. With this arrangement, the impedance of the RFI choke 24A would be between 1 kΩ and 10 kΩ.

While the example embodiment shows the wires 40 encased in the tubing 44, the present invention is not intended to be limited to any particular type of conductive material shielding, provided the shielding can perform as the RF choke described.

Figure 6:
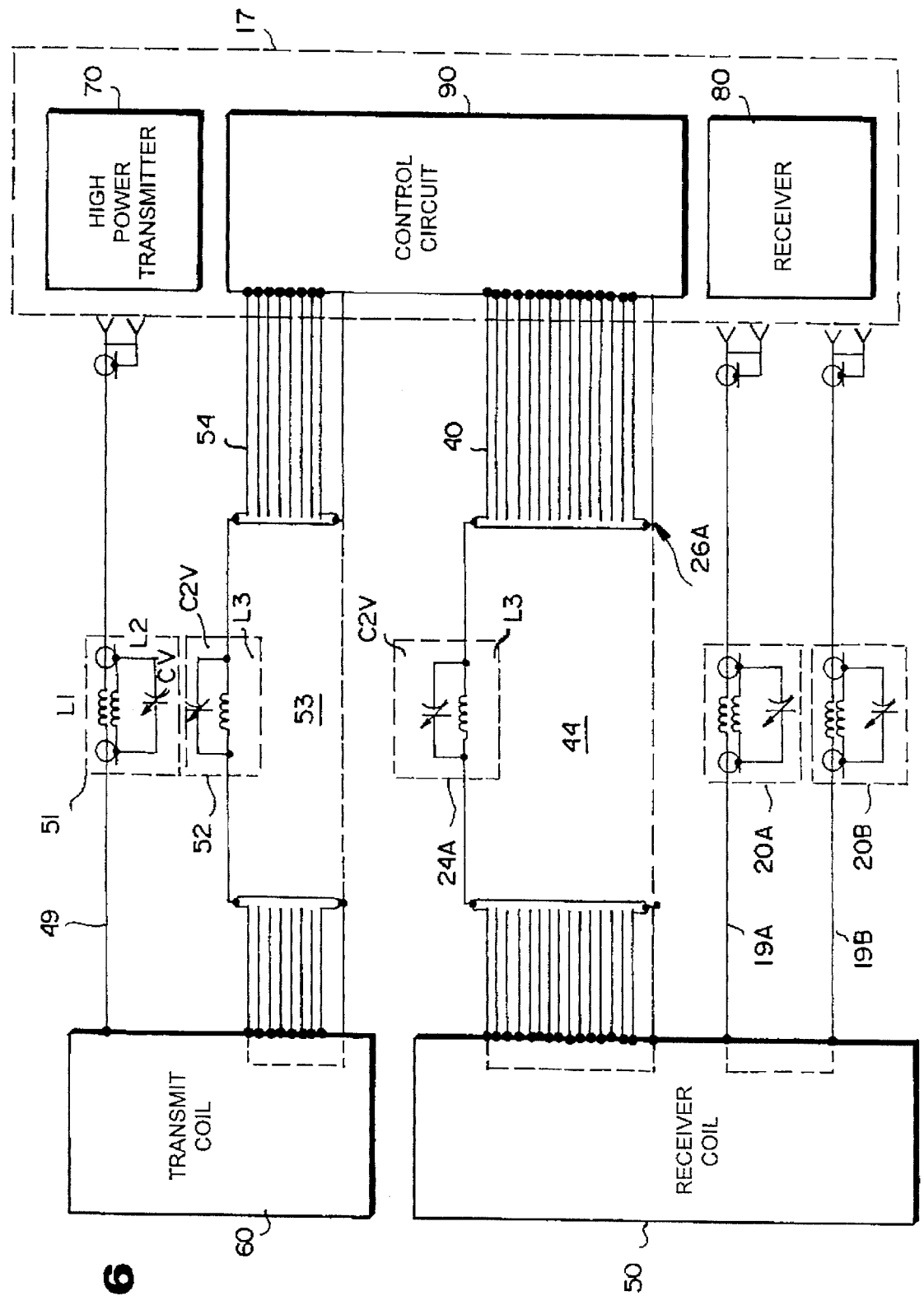
FIG. 6 is a schematic view of another embodiment of the present invention.

FIG. 6 shows an example of how the present invention may be used in conjunction with both receiver and transmitter coils. The receiver coil 50 includes a set of MRI receiver coils such as those shown in Figure 4. The transmit coil 60 includes at least one high powered RF transmit coil. The receiver coils 50 and the transmit coil 60 will each have appropriate control circuits (such as matching circuits) associated with them. The receiver coil 50 and transmit coil 60 are respectively connected to the RF controller 17. The RF controller 17 includes the control circuitry 90 (for both the transmit coil and the receive coils), the transmitter 70 and the receiver 80.

The connections between the receiver coils 50 and the control circuitry 90 and receiver 80 of FIG. 6 are similar to that shown in Figure 4. Specifically, the receiver coil 50 includes receiver coils, matching circuits, and detuning circuits that are connected to the control circuit 90 by control wires 40. The control wires 40 are shielded by the conductive tubing 44, which is grounded to the control circuitry 90. The conductive tubing 44 forms an RFI choke 24A, like that shown in FIG. 5. The receiver coil 50 is also connected to the receiver 80 by coaxial cables 19A and 19B, one for each receiver coil. The coaxial cables 19A–19B carry the MRI reception signals to the receiver 80.

The control wires 40 are shielded by the conductive tubing 44, which is grounded to the control circuitry 90 by shield ground 26A. The tubing 44 and control wires 40 form the RFI chokes 24A in the form of the coil shown in FIG. 3.

The transmit coil 60 is connected similarly to the control circuit 90 in the high power transmitter 70 as was the receiver coil 50. Specifically, the transmit coils are connected to the high power transmitter 70 by coaxial cable 49 with RFI choke 51. The cable 49 carries the transmit signals to the transmit coil 60. In addition, the transmit coils are controlled by the control circuit 90 via control wires 54 passing through a conductive tubing 53 which is formed in the form of an RFI choke 52 similar to that shown in FIG. 5. Like the RFI choke shown in FIG. 5, the tubing 53 formed into a number of turns in parallel with a variable capacitor $C2_v$ to form the RFI choke 52.

As may be seen from FIG. 6, by implementing the present RFI chokes 24A and 52 on each set of control lines between the transmitter coils 60, receiver coil 50 and control circuitry 90, together with an appropriate RFI choke 20A–20B and 51 between the respective receiver coil 50, transmit coil 60, transmitter 70 and receiver 80, all paths, including hidden ground paths, between 1) the receiver coil 50 and transmit coil 60, and 2) the transmitter 70, receiver 80, and control circuitry 16, are substantially interrupted to spurious RF energy.

Although the example shown in FIG. 6 implies one transmit coil is present (supplied by one cable 49 and one set of control lines 54) and two receive coils are present (supplied by two cables 19A and 19B and combined control lines 40), the number of transmit coils, number of receive coils, the number of sets of transmit coil control lines and the number of sets of receiver coil control lines will vary from one to any number, depending on the application.

While the invention has been described in connection with what is presently considered to be the most practical and preferred embodiment, it is to be understood that the invention is not to be limited to the disclosed embodiment, but on the contrary, is intended to cover various modifications and equivalent arrangements included within the spirit and scope of the appended claims.

What is claimed is:

1. A RF system, comprising:

a RF coil;

coil matching circuitry in electrical communication with the RF coil;

a controller;

a control line in electrical communication with the coil matching circuitry and the controller, the control line carrying a signal controlling the RF coil;

conductive shielding adjacent at least a portion of the control line, the conductive shielding having a coiled portion; and a reactive load electrically connected to the coiled portion.

2. The RF system according to claim 1, wherein the coil matching circuitry is also in electrical communication with the controller via a RF coaxial cable, the RF coaxial cable having another coiled portion connected to another reactive load.

3. The RF system according to claim 1, further including multiple control lines having at least portions adjacent the conductive shielding.

4. The RF system according to claim 1, further including:

multiple RF coils;

multiple coil matching circuits in electrical communication with corresponding ones of the RF coils;

multiple control lines in electrical communication with the controller and corresponding ones of the coil matching circuits; and multiple conductive shieldings adjacent at least a portion of corresponding ones of the multiple control lines, each conductive shielding having corresponding coiled portions; and multiple reactive loads connected to corresponding ones of the coiled portions.

5. The RF system according to claim 2, further including:

multiple RF coils;

multiple RF coaxial cables;

multiple coil matching circuits in electrical communication with corresponding ones of the RF coils and in electrical communication with the controller via corresponding ones of the RF coaxial cables;

multiple control lines in electrical communication with the controller and corresponding ones of the coil matching circuits; and multiple conductive shieldings adjacent at least a portion of corresponding ones of the control lines, each conductive shielding having corresponding first coiled portions; and multiple first reactive loads connected to corresponding ones of the first coiled portions, the RF coaxial cables having corresponding second coiled portions connected to corresponding second reactive loads.

6. The RF system according to claim 1, further including:

coil detuning circuitry in electrical communication with the control circuitry via additional control lines carrying additional control signals, the conductive shielding being adjacent at least a portion of each control line.

7. The RF system according to claim 1, wherein the conductive shielding surrounds the portion of the control line.

8. The RF system according to claim 1, wherein the reactive load is a capacitor connected in parallel to the coiled portion.

9. A RF coil system, comprising:

a controller to output control signals;

control lines;

an RF receiver coil system, connected to the output means by the control lines, for receiving a RF signal in response to the control signals;

a RF choke, including:

conductive shielding near the control lines, electrically connected to the controller and the receiver coil system, whereby the conductive shielding substantially shields the control lines from the RF signal, a portion of the conductive shielding being in the form of an inductive load, and a reactive load connected to the conductive shielding.

10. The RF system according to claim 9, wherein the inductive load is a coil of the conductive shielding.

11. The RF system according to claim 9, wherein the RF receiver coil system includes a RF coil, a matching circuit and a detuner.

12. The RF system according to claim 9, wherein the conductive shielding surrounds the control lines.

13. A RF system comprising:

a RF receiver coil having a RF signal output and a receiver control signal input;

a RF transmitter coil having a RF signal input and a transmitter control signal input;

a transmitter having a transmitter signal output;

a receiver having a receiver signal input;

a control circuit having a receiver control signal output and a transmitter control signal output;

a first shielded cable electrically connecting the RF signal output to the receiver signal input, the first shielded cable having a portion formed in a first coil;

a second shielded cable electrically connecting the RF signal input to the transmitter signal output, the second shielded cable having a portion formed in a second coil;

first control lines, housed in a first conductive shield having a portion formed in a third coil, electrically connecting the receiver control signal input to the receiver control signal output;

second control lines, housed in a second conductive shield having a portion formed in a fourth coil, electrically connecting the transmitter control signal input to the transmitter control signal output.

14. The RF system according to claim 13, further including first, second, third and fourth reactive loads connected to, respectively, the first, second, third and fourth coils.

\* \* \* \* \*